US005468581A

United States Patent [19]

Coe et al.

[11] Patent Number: 5,468,581

[45] Date of Patent: Nov. 21, 1995

[54] VERIFICATION LATENT IMAGE

[75] Inventors: Robert P. Coe, Grand Island, N.Y.; Theodore Blend, Buckhannon, W. Va.

[73] Assignee: Moore Business Forms, Inc., Grand Island, N.Y.

[21] Appl. No.: 145,639

[22] Filed: Nov. 4, 1993

[51] Int. Cl.[6] ........ G03F 9/00

[52] U.S. Cl. ........ 430/22; 430/10; 430/354; 430/952; 355/77; 283/91

[58] Field of Search ........ 430/22, 10, 354, 430/952; 355/77; 283/91

[56] References Cited

U.S. PATENT DOCUMENTS

| | | | |
|---|---|---|---|
| 4,033,059 | 7/1977 | Hutton et al. . | |
| 4,143,967 | 3/1979 | Wicker | 355/77 |
| 4,210,345 | 7/1980 | Kosche . | |
| 4,265,469 | 5/1981 | Mowry, Jr. et al. . | |
| 4,715,623 | 12/1987 | Roule et al. . | |
| 4,932,685 | 6/1990 | Mancuso . | |

OTHER PUBLICATIONS

The Printing Ink Manual, Van Nostrand Reinhold, 1979, pp. 58, 128, 189, 190.

*Primary Examiner*—S. Rosasco

*Attorney, Agent, or Firm*—Nixon & Vanderhye

[57] ABSTRACT

A security document with a design (e.g. a generally oval seal) is constructed in such a way that the design is full value halftone, such as produced from juxtaposed line screens having a frequency between 100–133 lines per inch. Negative and positive masks having an image (e.g. arabic numeral, letter, or other symbol), are used with the screens to produce a printing plate. A document is printed with the printing plate in a conventional lithographic process, and there is an overprinting on the design (at least that portion having the image) with a white opaque ink or overprint varnish to produce an image. The image is not readily visible to the naked human eye when viewed generally perpendicular to the plane of the document, but is readily visible by the naked human eye when the document is tilted so that it is viewed distinctly non-perpendicular to the plane of the document. A fluorescent material or brightener may be added to the white ink, and the image will then also be visible by shining long wave length black light on the design.

13 Claims, 3 Drawing Sheets

VERIFICATION LATENT IMAGE

BACKGROUND AND SUMMARY OF THE INVENTION

Many different types of security documents are utilized in commerce, such as watermarked paper, visible and invisible fibers, optical variable inks, holograms, latent images (e.g. see U.S. Pat. Nos. 4,715,623, 4,033,059 and 4,210,345), security threads with microprinting, and the like, in order to thwart counterfeiters. Latent images have been used in security printing for many years by bank note printers using an intaglio process (utilizing engraved steel printing plates). The latent image was visible when a document printed thereby was viewed at an angle, and the image was caused by the formation of a slight shadow from the raised ink pattern deposited by the engraved printing plate. The shadow was caused by each of the raised ridges that occurred during the printing of the pattern. Most of the printing is done using a 120 line line screen producing a shadow in the direction away from the light source for each of the 120 lines. That is, the shadows so produced on the document create what appears to be a hidden image.

The invention relates to a particular method of providing a latent image, and the document produced thereby, that is relatively easy to practice using conventional materials, is well camouflaged when normally viewed, yet readily revealed to the naked human eye simply by tilting the document (e.g. at an angle of about 45–90 degrees to perpendicular). The invention also is readily adaptable to the inclusion of fluorescent material or brighteners in the ink providing the latent image, so that the latent image may also be revealed by shining a long wave length black light thereon. The latent image produced according to the invention is produced by a combination of line images similar to the intaglio process, but highlights the image when held at an angle to the light by a change in the reflected light. This creates the illusion of different densities of color, revealing the latent image.

According to one aspect of the present invention, a method is provided of producing a security feature on a document disposable in a plane. The method comprises the steps of: (a) making first and second halftone line screens of the same design; (b) superimposing the first and second screens one upon the other so that the designs provided thereon are juxtaposed; (c) producing a copy film having a full value halftone using the screens; (d) making image masks; (e) juxtaposing the image masks and copy film to produce a printing plate; (f) printing the design with latent image on a document using the printing plate; and (g) overprinting at least part of the design with an ink or varnish; and wherein steps (a)–(g) are practiced so as to produce an image in the design on the document which is not readily visible to the naked human eye when viewed generally perpendicular to the plane of the document, but which is readily visible by the naked human eye when the document is tilted so that it is viewed distinctly non-perpendicular to the plane of the document.

Steps (d) and (e) are preferably practiced to make first and second masks, one with an image, and one without, and positioning the masks so that they align with the design on the copy film, and then transferring the design and image from the copy film and masks to the printing plate.

Step (c) is preferably practiced by exposing the film once, then removing the film from registration and rotating the screens at a predetermined angle (e.g. 90, 60, or 45 degrees) and then re-registering the film with the screens and making a second exposure before developing the film. Additional exposures can also be made before developing as necessary to produce a full value halftone.

Step (a) is preferably practiced to produce screens with a frequency of lines in the range of 100–133 lines/inch, e.g. 120 lines/inch; and step (f) by conventional lithographic printing. Step (g) may be practiced by using an opaque white ink or overprint varnish, or a clear, dull, or matte finish ink or varnish. The design produced by the method may be a seal, e.g. having a generally oval configuration, or a border. The image produced may be in the form of an arabic numeral, a letter, or other symbol (e.g. a logo).

Step (g) also may be practiced with a white ink containing a fluorescent material or brightener. The fluorescent material or brightener makes the latent image more visible when viewed at an angle, however then the method may also comprise the further step of shining long wave length black light on the document to reveal the image.

The invention also comprises a document made by the method described above.

According to another object of the present invention, a security paper document having a planar surface is provided. The document comprises: a full value halftone image printed on the planar surface; a clear, dull or matte finish ink or varnish overprinted on at least that portion of the design having the image; and the image not readily visible by the naked human eye when viewed generally perpendicular to said planar surface of the document, but being readily visible by the naked human eye when the document is tilted so that it is viewed distinctly non-perpendicular to the planar surface of the document.

The full value halftone seal may be formed by conventional lithographic printing processes using halftone line screens having a frequency within the range of 100–133 lines/inch. The image ink or varnish may be opaque white ink or overprint varnish, e.g. white ink with a fluorescent material or brightener. The design may be a seal, e.g. one generally oval in shape, and the image may be an arabic numeral, a letter, or other symbol (e.g. logo).

It is the primary object of the present invention to provide a security document with a readily revealed latent image, and a simple yet effective manner of production thereof. This and other objects of the invention will become clear from an inspection of the detailed description of the invention, and from the appended claims.

DETAILED DESCRIPTION OF THE DRAWINGS

The invention comprises a method of producing a document that includes a design (such as a seal) which reveals a latent image when viewed at an angle (e.g. about 45–90 degrees from perpendicular) distinctly non-perpendicular to the plane of the document, and the document so produced. Exemplary steps for practicing the method according to the invention are illustrated schematically in FIG. 1.

Figure 1:
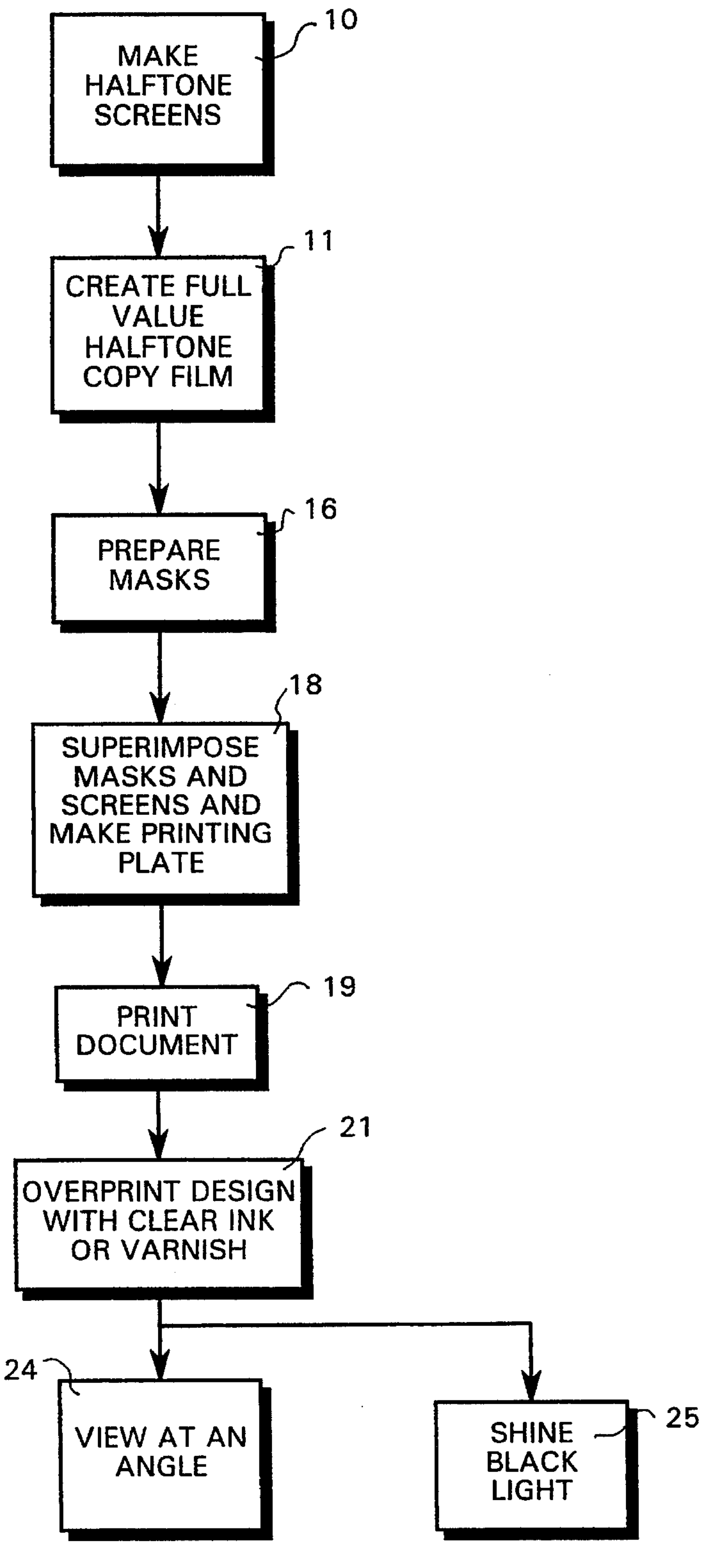
FIG. 1 is a box diagram schematically showing exemplary steps for practicing an exemplary method according to the present invention.

As seen in FIG. 1, first contact screens are made—as indicated schematically at 10—which screens provide specialized effect whereby lines change width to produce shadows and highlights needed for halftone reproduction. That is, two halftone line screens are constructed with a desired design (art work) thereon, each line screen having a frequency of about 100–133 lines per inch (e.g. about 120 lines per inch).

After step 10, step 11 is practiced. In the practice of step 11, typically, a black and white of the design (such as engraved art work) is placed on a copy board of a copy camera. The copy board holds the original copy while it is being photographed by the camera. Copy film (typically a plate) is placed on the back board of the copy board to receive the photographic image from the art work once the film is exposed. A contact screen (from step 10) is positioned over the film in the X or Y axis, and a film positive (preformed mask) is pinned over the screen so that the latent image to be formed will appear exactly where it is to appear on the copy. The film is then exposed to create a full value halftone. The film is then removed from the registration with the copy board, the contact screen is rotated to another position (e.g. 90, 60, or 45 degrees), then the film is re-registered with the screen and the copy film, and a second exposure is made. The number of exposures is increased, as necessary, until a full value halftone is produced (i.e. like typical halftones produced in connection with continuous tone photographs prepared for litho printing). If additional exposures are required, the exposure time should be substantially equal to the time of each of the first two exposures.

Figure 3:
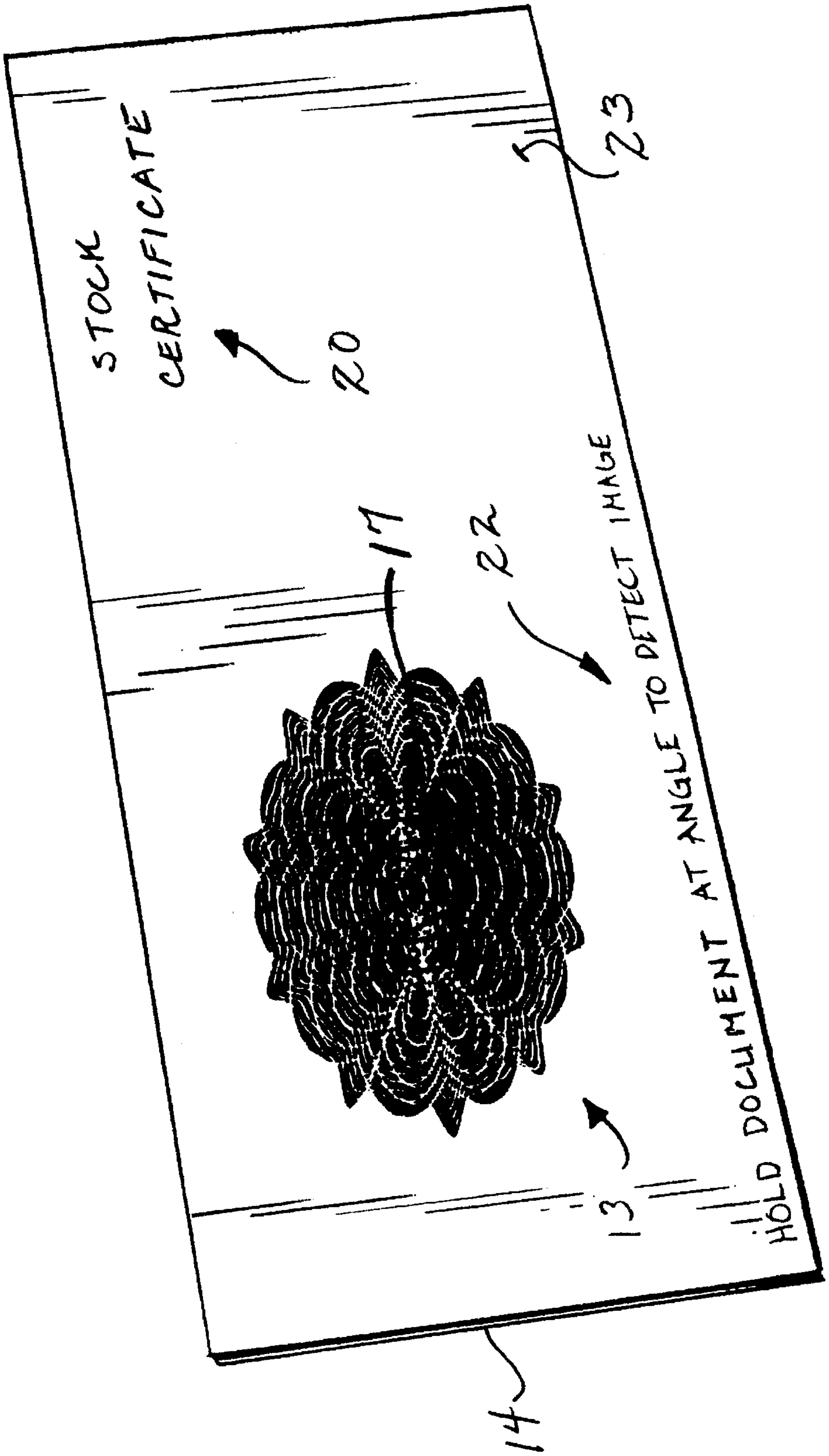
FIG. 3 is a perspective view of the document of FIG. 2, held at an angle that allows the latent image thereon to be seen.

Masks are also prepared, as indicated at 16 in FIG. 1, such as one with an image 17 such as a letter (the letter "M" in FIG. 3), arabic numeral, or other symbol (e.g. logo), and the other without. These masks are the positive and negative exposures of one another. If the M of FIG. 3 is produced, the "solid M" of one mask is placed over one of the screens from step 10 and masks out the indicia once the film is exposed. The "clear M" mask is placed over another screen from step 10 in the same fashion and allows the M to be photographed with the pattern of the design showing through after exposure. Thus there are now two films, one with the pattern of the design (e.g. seal) with the "M" (image) cut out, and the second with just the "M" having that portion of the pattern covered by the "M" filling in the area of the "M".

Then the two films are juxtaposed one over the other to transfer the combined pattern and image onto the printing plate, as indicated by step 18 in FIG. 1. The printing plate then prints (see step 19 in FIG. 1) the latent image (17 in FIG. 3) on a document (see the document 14 in FIG. 2). Printing is practiced in a conventional fashion with the printing plate, producing print having raised ink patterns. At least part of the design 13 (see FIG. 2)—at least that portion having the image 17—is then overprinted (see step 21 in FIG. 1) using an ink or varnish, such as an opaque white ink, or an overprint varnish, or a clear, dull, or matte ink or varnish. For example PMS Opaque White Ink, or AVX 300 Overprint Varnish, both available from Graphic Fine Color of Annapolis Juntion, Md., may be utilized, as may other overprint inks or varnishes. The same mask used to create the image 17 may be used in the overprinting process 21 if desired.

Figure 2:
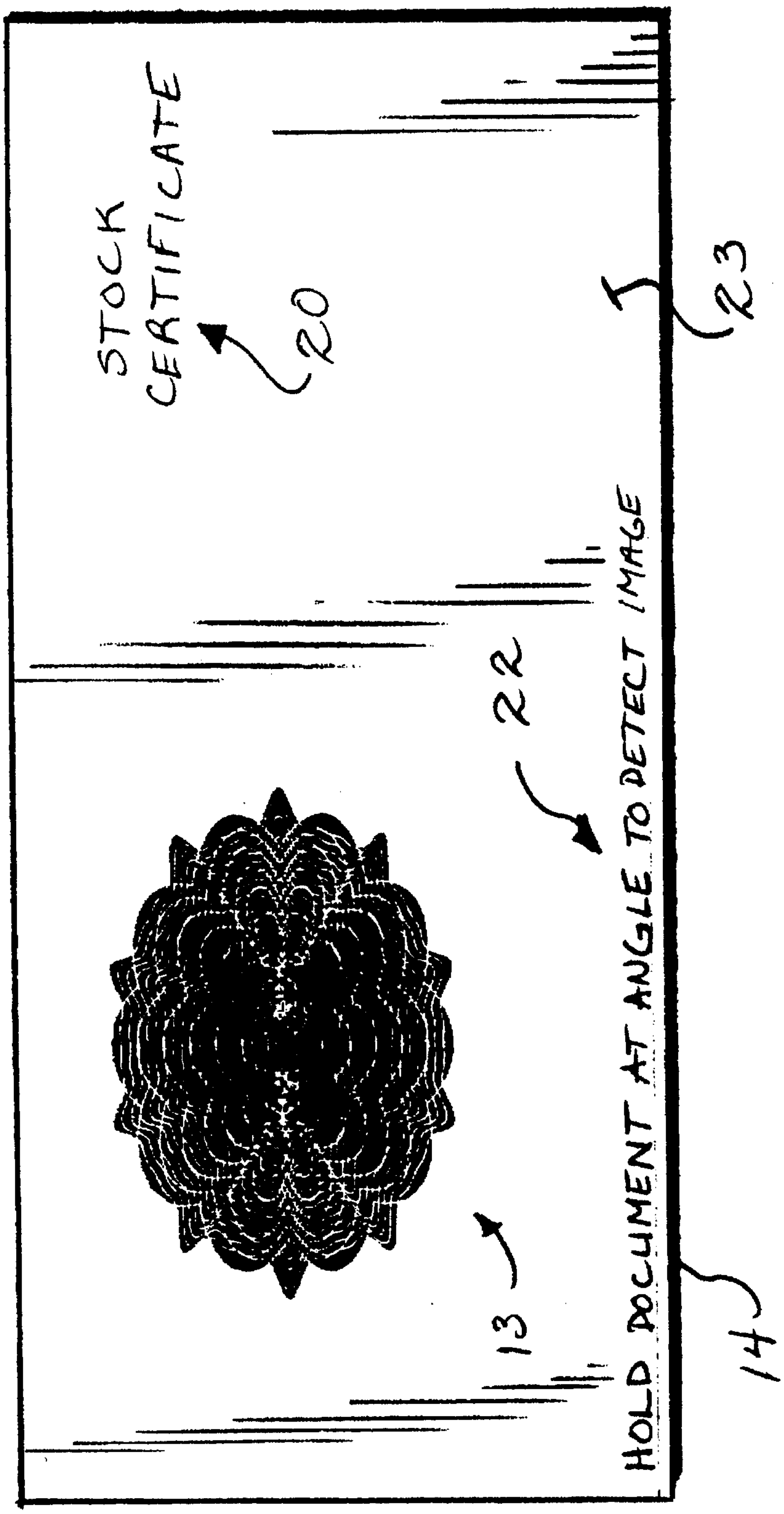
FIG. 2 is a top plan view of an exemplary security document according to the present invention.

The design may be a seal, such as the generally oval (although with an irregular border) in configuration, seal shown by reference numeral 13 in FIGS. 2 and 3. An exemplary paper document on which it is printed is shown by reference numeral 14. The document 14 produced according to the invention, which may be a security document (e.g. having indicia 20 thereon indicating that it is a bond, check, stock certificate, property title, etc.), does not readily reveal the image 17 to the naked human eye when viewed generally perpendicular to the plane of the document 14—such as seen in FIG. 2. However, the image 17 is readily visible by the naked human eye when the document is tilted so that it is viewed distinctly non-perpendicular to the plane of the document, as schematically indicated at 24 in FIG. 1, and as illustrated in FIG. 3. Indicia 22 may be printed on the same planar surface 23 of the document 14 as the seal 13 and image 17 to instruct a user as to how to reveal the latent image 17.

Instead of a seal, the design 13 according to the invention may be a border, or part of a border, of a document 14, or other feature.

In order to enhance the visibility of the image 17 when the document 14 is tilted, and/or to provide another security check for the document 14, according to the invention a conventional fluorescent material or brightener, such as an anionic stilbene derivative such as LEUCOPHOR B-302, available from Sandoz of Charlotte, N.C., may be added to the over print ink, e.g. an opaque white ink overprinting the image 17. The image 17 is then also revealed by shining a long wave length black light on the seal 13, as indicated schematically at 25 in FIG. 1.

It will thus be seen that according to the present invention a method of producing a security document with latent image seal, and a security document with latent image seal, have been provided. While the invention has been herein shown and described in what is presently conceived to be the most practical and preferred embodiment thereof, it will be apparent to those of ordinary skill in the art that many modifications may be made thereof within the scope of the invention, which scope is to be accorded the broadest interpretation of the appended claims so as to encompass all equivalent methods or documents.

What is claimed is:

1. A method of producing a security feature on a document disposable in a plane, comprising the steps of:

(a) making first and second halftone line screens of the same design;

(b) superimposing the first and second screens one upon the other so that the designs provided thereon are juxtaposed;

(c) producing a copy film having a full value halftone using the screens;

(d) making image masks;

(e) juxtaposing the image masks and copy film to produce a printing plate;

(f) printing the design with latent image on a document using the printing plate; and (g) overprinting at least part of the design with an ink or varnish; and wherein steps (a)–(g) are practiced so as to produce an image in the design on the document which is not readily visible to the naked human eye when viewed generally perpendicular to the plane of the document, but which is readily visible by the naked human eye when the document is tilted so that it is viewed distinctly non-perpendicular to the plane of the document.

2. A method as recited in claim 1 wherein steps (d) and (e) are practiced to make first and second masks, one with an image, and one without, positioning the masks so that they align with the design on the copy film, and then transferring the design and image from the copy film and masks to the printing plate.

3. A method as recited in claim 1 wherein step (c) is practiced by exposing the film once, then removing the film from registration; then rotating the screens at a predetermined angle; and then re-registering the film with the screens and making a second exposure before developing the film.

4. A method as recited in claim 3 wherein said rotating step is practiced to effect rotation at an angle of about 90, 60, or 45 degrees.

5. A method as recited in claim 3 comprising the further step of making additional exposures before developing, the number of exposures being as necessary to produce a full value halftone.

6. A method as recited in claim 1 wherein step (a) is practiced to produce screens with a frequency of lines in the range of 100–133 lines/inch, and step (f) is practiced by lithographic printing.

7. A method as recited in claim 1 wherein step (g) is practiced a clear, dull, or matte finish ink or varnish.

8. A method as recited in claim 1 wherein step (h) is practiced to provide a seal having a generally oval configuration as the design.

9. A method as recited in claim 1 wherein step (d) is practiced to provide an image in the form of an arabic numeral, a letter, or other symbol.

10. A method as recited in claim 1 wherein step (g) is practiced by using an opaque white ink or overprint varnish.

11. A method as recited in claim 1 wherein step (g) is practiced with a white ink containing a fluorescent material or brightener; and comprising the further step of shining long wave length black light on the document to reveal the image.

12. A method as recited in claim 1 wherein step (g) is practiced using a mask from steps (d) and (e).

13. A security paper document having a planar surface, produced by the steps of:

(a) making first and second halftone line screens of the same design;

(b) superimposing the first and second screens one upon the other so that the designs provided thereon are juxtaposed;

(c) producing a copy film having a full value halftone using the screens;

(d) making image masks;

(e) juxtaposing the image masks and copy film to produce a printing plate;

(f) printing the design with latent image on a document using the printing plate; and (g) overprinting at least part of the design with an ink or varnish; and the image in the design on the document not being readily visible to the naked human eye when viewed generally perpendicular to the plane of the document, but being readily visible by the naked human eye when the document is tilted so that it is viewed distinctly non-perpendicular to the plane of the document.

* * * * *